US008843350B2

(12) United States Patent
Jacobi et al.

(10) Patent No.: US 8,843,350 B2
(45) Date of Patent: Sep. 23, 2014

(54) FACILITIES MANAGEMENT SYSTEM

(75) Inventors: Jim Jacobi, The Woodlands, TX (US); Scott Gauthier, Houston, TX (US)

(73) Assignee: Walter P. Moore and Associates, Inc., Houston, TX (US)

( * ) Notice: Subject to any disclaimer, the term of this patent is extended or adjusted under 35 U.S.C. 154(b) by 529 days.

(21) Appl. No.: 13/152,883

(22) Filed: Jun. 3, 2011

(65) Prior Publication Data
US 2012/0310602 A1    Dec. 6, 2012

(51) Int. Cl.
*G06F 17/50* (2006.01)
(52) U.S. Cl.
CPC ................................. *G06F 17/5004* (2013.01)
USPC .......................................................... 703/1
(58) Field of Classification Search
None
See application file for complete search history.

(56) References Cited

U.S. PATENT DOCUMENTS

| 5,754,842 | A | * | 5/1998 | Minagawa | 700/97 |
| 6,643,695 | B1 | * | 11/2003 | Takagi et al. | 709/224 |
| 6,745,200 | B2 | * | 6/2004 | Starkey | 707/812 |
| 6,768,928 | B1 | * | 7/2004 | Nagasawa et al. | 700/98 |
| 7,058,508 | B2 | * | 6/2006 | Combs et al. | 701/484 |
| 7,519,449 | B2 | * | 4/2009 | Rhee et al. | 700/182 |
| 7,814,582 | B2 | * | 10/2010 | Reddy et al. | 4/302 |
| 7,859,655 | B2 | * | 12/2010 | Troy et al. | 356/141.2 |
| 7,912,744 | B2 | * | 3/2011 | Combs et al. | 705/7.21 |
| 8,035,638 | B2 | * | 10/2011 | Pelletier-Doyle et al. | 345/419 |
| 8,086,477 | B2 | * | 12/2011 | Gross et al. | 705/7.12 |
| 8,116,529 | B2 | * | 2/2012 | Edwards | 382/104 |
| 8,198,617 | B2 | * | 6/2012 | Georgeson et al. | 250/559.4 |
| 8,356,244 | B2 | * | 1/2013 | Vandermolen et al. | 715/230 |
| 8,548,619 | B2 | * | 10/2013 | Richey | 700/98 |
| 8,645,228 | B2 | * | 2/2014 | Moussa et al. | 705/26.8 |
| 8,666,702 | B2 | * | 3/2014 | Schell | 703/1 |
| 2002/0026385 | A1 | * | 2/2002 | McCloskey et al. | 705/27 |
| 2002/0052709 | A1 | * | 5/2002 | Akatsuka et al. | 702/153 |
| 2002/0093538 | A1 | * | 7/2002 | Carlin | 345/778 |
| 2002/0095323 | A1 | * | 7/2002 | Combs et al. | 705/8 |
| 2002/0161533 | A1 | * | 10/2002 | Uegaki | 702/35 |
| 2003/0004908 | A1 | * | 1/2003 | Linthicum et al. | 706/45 |
| 2003/0081849 | A1 | * | 5/2003 | Smith | 382/241 |
| 2003/0130758 | A1 | * | 7/2003 | Hirano et al. | 700/182 |
| 2003/0135846 | A1 | * | 7/2003 | Jayaram et al. | 717/137 |

(Continued)

OTHER PUBLICATIONS

Jacobi, Jim. "BIM to FIM: Enabling the Digital Revolution in Project Development & Operation." Abstract from AEC Technology Strategies Conference. Accessed at http://www.aectechstrategies.com/agenda.html?dis=EMNV9 on May 3, 2011, pp. 1-5.

*Primary Examiner* — Omar Fernandez Rivas
*Assistant Examiner* — Kibrom K Gebresilassie
(74) *Attorney, Agent, or Firm* — Fulbright & Jaworski LLP

(57) ABSTRACT

Long-term facility maintenance may be more efficient when data from multiple sources are combined onto an easily navigable display. In particular, building model data from a three-dimensional computer assisted design (CAD) file may be combined with maintenance information from a computerized maintenance management system (CMMS) and other data sources such as user's manuals and repair guides. The combined data may be accessible through a three-dimensional display of the building on a mobile device. The mobile device allows a user to navigate through the building and select components to view additional maintenance information for the selected components. The display may interact with location sensing devices, such as GPS, in the mobile device to automatically display model data near the user's location. Additionally, a user may modify component information on the mobile device, which is transmitted to the CMMS to update the stored component information.

23 Claims, 13 Drawing Sheets

(56) References Cited

U.S. PATENT DOCUMENTS

| | | | |
|---|---|---|---|
| 2003/0172366 A1* | 9/2003 | Rhee et al. | 717/100 |
| 2003/0202120 A1* | 10/2003 | Mack | 348/578 |
| 2004/0117777 A1* | 6/2004 | Lichana | 717/151 |
| 2005/0024364 A1* | 2/2005 | Shouen | 345/501 |
| 2005/0068316 A1* | 3/2005 | Endo et al. | 345/419 |
| 2005/0144598 A1* | 6/2005 | Sabadell et al. | 717/137 |
| 2005/0187739 A1* | 8/2005 | Baust et al. | 702/184 |
| 2005/0222889 A1* | 10/2005 | Lai et al. | 705/9 |
| 2006/0005312 A1* | 1/2006 | Reddy et al. | 4/668 |
| 2006/0036756 A1* | 2/2006 | Driemeyer et al. | 709/231 |
| 2006/0074608 A1* | 4/2006 | Clay et al. | 703/1 |
| 2006/0074609 A1* | 4/2006 | Freeman et al. | 703/1 |
| 2007/0104360 A1* | 5/2007 | Huang et al. | 382/154 |
| 2008/0004993 A1* | 1/2008 | Horspool et al. | 705/28 |
| 2008/0189083 A1* | 8/2008 | Schell | 703/1 |
| 2010/0198383 A1* | 8/2010 | Richey | 700/98 |
| 2010/0223163 A1* | 9/2010 | Edwards | 705/29 |
| 2010/0257464 A1* | 10/2010 | Renner | 715/757 |
| 2011/0087517 A1* | 4/2011 | Abbott | 705/7.28 |
| 2011/0166831 A1* | 7/2011 | Snyder et al. | 703/1 |
| 2011/0276886 A1* | 11/2011 | Hall et al. | 715/734 |
| 2011/0301919 A2* | 12/2011 | Mr. Snyder et al. | 703/1 |
| 2012/0116728 A1* | 5/2012 | Shear et al. | 703/1 |

* cited by examiner

FACILITIES MANAGEMENT SYSTEM

TECHNICAL FIELD

The present application is directed to methods and apparatuses for improved facilities management. Specifically, the present application is directed towards software applications for use by a facilities management staff in viewing and managing building components.

BACKGROUND

The lifecycle of a commercial building typical spans three phases—design, construction, and operation. In recent years, engineering firms involved in the first two phases—design and construction—have begun to use advanced tools to capture and present information about the building. As an example, one or more Building Information Models (BIMs) may be developed by various project participants. A BIM is a three-dimensional (3D) computer assisted design (CAD) model of the building integrated with information about various building components represented in the model. Separate BIMs may be developed for various design aspects of the building such as, for example, structural, civil, architectural, and MEP (mechanical, electrical, and plumbing). Examples of conventional software for developing BIMs include Revit, Civil3D, AutoDesk, Tekla, Pipe3D, Catia, Digital Project, Bentley Project, AutoCad 3D, SketchUp, Rhino, NavisWorks, and Grasshopper.

In a typical project, not all useful information is included in one BIM. For example, a BIM generated by an MEP contractor during the design phase is unlikely to contain complete information on all mechanical, electrical, and plumbing components that will eventually be included in the building. Rather, that BIM likely will simply reserve space for such components. During the construction phase, as purchase decisions are made for various building components, additional BIMs may be created by contractors with additional information on the actually purchased components. As an example, a BIM created in the design phase may designate a space for a chiller, but contain no further information. A separate BIM created by a different company during the construction phase may include additional information about the chiller actually purchased and installed, such as the model and serial number. Additionally, neither of these BIMs may include architectural elements, which are instead included in a separate BIM.

During the third phase of the building, the operations phase, a facilities management (FM) group oversees maintenance and repair of the building. To manage these tasks, FM groups typically utilize a computerized maintenance management system (CMMS). Examples of conventional CMMSs include Mainsaver, Maximo, and FM Desktop. The CMMS may include information to assist FM staff such as scheduled and unscheduled maintenance tasks and completed and repair request tickets. A CMMS typically includes a textual listing of building components, with each typically assigned a serial number or other unique identifier and a textual designation of location within the building. To locate a component within the building, a facilities management employee must manually cross-reference the textual location of the component listed in the CMMS with 2D CAD drawings. Such drawings are typically provided to the FM staff for reference at the completion of construction. An illustration of a conventional 2D CAD drawing is shown in FIG. 1.

2D CAD drawings are not an efficient tool for FM because they generally do not include much data. Thus, the FM staff may be required to locate an identifier for a component on the 2D CAD drawing and search additional documents to locate information about the component. For example, in addition to manually cross-referencing location information with 2D CAD drawings, a facilities management employee may also need to manually access additional paper and electronic repositories to learn more information about the component, such as through a user's manuals. Additionally, 2D CAD drawings are not updated as the building is updated. Building configuration changes, building additions, and building removals are not entered into the original 2D CAD drawings. Instead, these changes may be reflected in additional 2D CAD drawings. These additional 2D CAD drawing may only reflect the updated portions and may require the FM staff to reference those drawings in combination with the original 2D CAD drawings and other reference materials.

Currently, the wealth of information created during the design and construction phases of a building and captured in various BIMs remain unavailable to a FM staff during the operations phase. Even if a contractor were to provide a BIM file to the FM group, a typical facilities management group does not have access to or experience with the advanced 3D modeling software necessary to view and utilize a BIM. Additionally, because relevant information is typically spread across several different BIMs created by different contractors in various phases of the project, there is no one single source of useful information.

A BIM viewing application would also not be able to replace all functions of a legacy CMMS system such as, for example, logging and scheduling maintenance activities and managing help tickets. It would also be costly and disruptive for a FM group to replace an existing legacy CMMS system.

Therefore a solution is needed to provide FM groups the benefit of the information and visualization available in a BIM in a user-friendly package and to integrate with the existing information and functionality of a legacy CMMS system with the BIM information.

BRIEF SUMMARY

According to one embodiment, a method includes retrieving from a first data source data representing an environment in a building and at least one component in the environment. The method also includes displaying a three-dimensional model illustrating data from the first data source, including the at least one component. The method further includes receiving a request for information regarding a component selected from the at least one component. The method also includes retrieving information regarding the selected component from a second data source different from the first data source. The method further includes displaying the information regarding the selected component. The first data source and the second data source each contain a record for the selected component and the record of the first data source and the record of the second data source include an identifier identifying the selected component.

According to another embodiment, a computer program product includes a non-transitory computer readable medium having code to retrieve from a first data source data representing an environment in a building and at least one component in the environment. The medium also includes code to display a three-dimensional model illustrating data from the first data source, including the at least one component. The medium further includes code to receive a request for information regarding a component selected from the environment. The medium also includes code to retrieve information regarding the selected component from a second data source different from the first data source. The medium further includes code to display the information regarding the selected component.

According to a further embodiment, a method includes providing a three dimensional computer assisted design (3D CAD) model to a client. The method also includes providing an interface for the 3D CAD model to the client including access to a computerized maintenance management system (CMMS). The method further includes providing updates to the 3D CAD model to the client on a subscription basis.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing.

DETAILED DESCRIPTION

Integration Process

Figure 1:
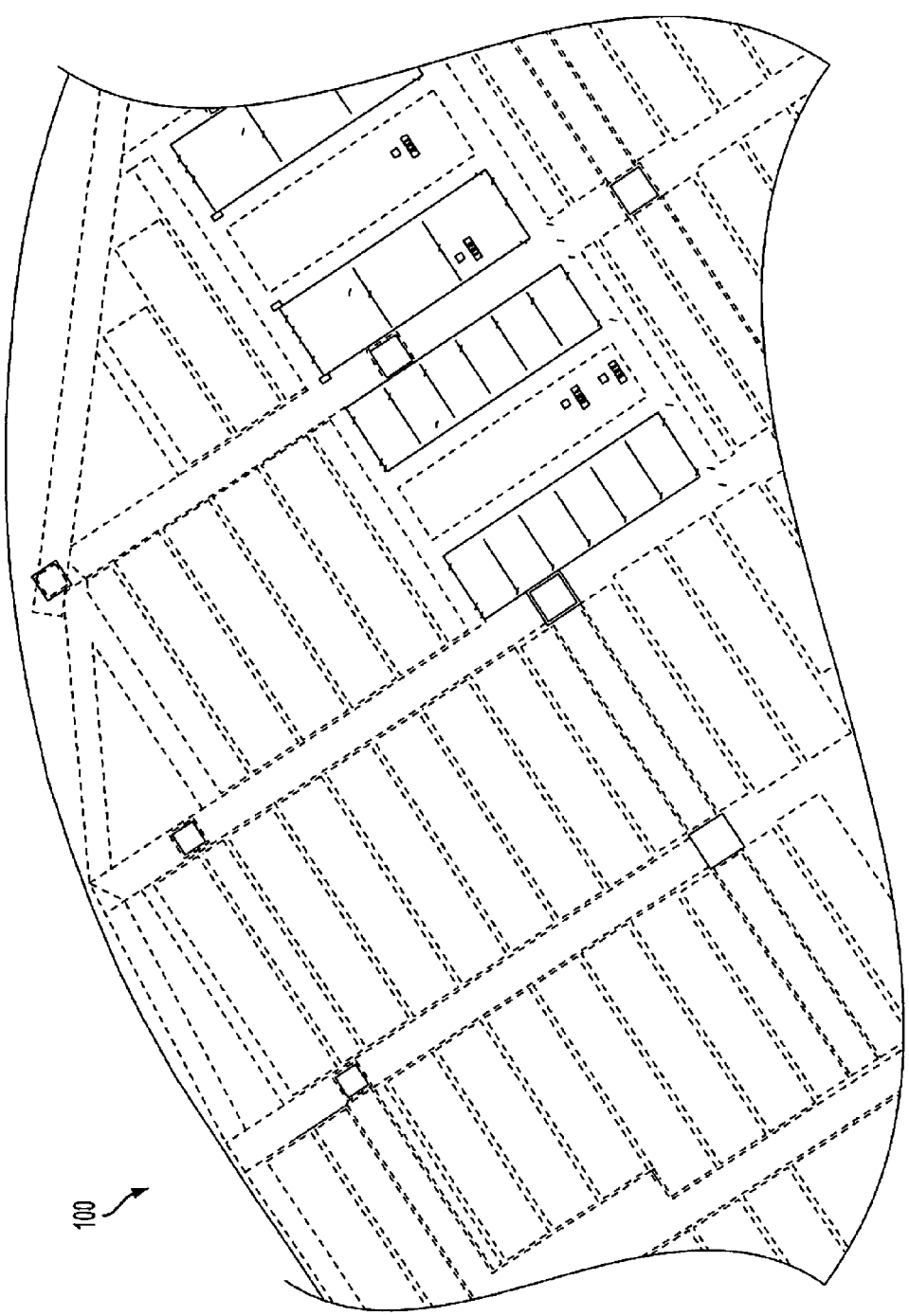
FIG. 1 is a drawing illustrating a conventional two-dimensional computer assisted design drawing of a building.

As discussed above, at the conclusion of the construction phase of a building lifecycle, various contractors may have developed numerous separate BIMs. To make those BIMs useful to an FM group, it may be necessary to combine these BIMs into a single virtual model. Such a process is called "coordination" and may consist of stacking the models, identifying clashes, identifying other coordination issues, and resolving all clashes and coordination issues. NavisWorks is a software package that may be used to assist in this process. The aggregated virtual model may take any appropriate form, such as a single BIM file, or multiple files aggregated using appropriate software. Some engineering firms may provide coordination services as part of project management during the design phase of the project to, for example, integrate BIMs from structural, civil, architectural, and/or MEP engineers as part of a multi-disciplinary review process. The same techniques applied in those situations would be applicable to this task. In some projects, it may not be necessary to perform coordination as a single BIM may include sufficient information.

According to one embodiment, aggregating information from multiple BIMs may include adapting information from multiple platforms and having one sub-contractor build upon another sub-contractor's BIM. For example, a civil engineering firm may plan a steel structure for a building. Then, a steel fabrication sub-contractor may use the civil engineering firm's steel model and input fabrication information such as steel manufacturing information or CNC layouts. Thus, the civil engineering model includes both structural information and component information aggregated together. Previously, this information would not be saved or would not be locatable within a single model. Instead, when FM required information FM would search through many poorly indexed document collections. Similar collections of data may be obtained from, for example, electrical engineering firms and electricians. NavisWorks, a commercial software package, is one example of software that may be used for "stacking" multiple BIMs and creating a single aggregate model.

Once information is aggregated into a single virtual model, building components in the BIM must be linked to the corresponding records for those same components in the CMMS. Methods for accomplishing this linking may depend on the stage of the project. In some embodiments, a unique key may be used to identify each component. In some CMMS systems, each component is assigned an asset number. For projects where a CMMS database has not yet been established, the BIM file may be used to generate original CMMS database records, insuring that components in the BIM file and the CMMS file share the same identifying asset number or other identifier, which FM may provide. For projects where a CMMS database is already in operation, a link table may be created to link each component number or other identifier in the BIM file with the corresponding component number or other identifier for that component in the CMMS database. Other techniques for linking BIM data and CMMS data may also be used. For example, a database containing a single entry for each component including all information needed for both BIM and CMMS purposes may be created. As another example, asset numbers assigned to components in CMMS records may be added to the corresponding component record in the virtual model using any appropriate technique.

Once BIM and CMMS information have been linked, either by use of a common key, linking table, or any other manner, the FM staff may use the integration system described below. Over the lifetime of the building, construction and repairs may necessitate updating of the CMMS and BIM data. For example, a component may be replaced or moved. In some instances, the facilities management staff may update the relevant information through the CMMS system or the integration system discussed below. In other instances, it may be appropriate for an engineering firm or other group familiar with the virtual model creation and modification process to update the virtual model.

Integration System

Using an integration system, model data and maintenance data for a building may be combined and viewed through an interactive user display to improve access to maintenance information. A three-dimensional (3D) model may be presented to a user having a similar appearance to the building. The user may navigate through the model to identify components for maintenance. According to one embodiment, the user's location may be determined and the model for the user's location displayed. When the model data and maintenance data are stored in separate databases, an identifier for a component in the model data may be correlated with an identifier for the component in the maintenance information to allow automated access to maintenance information from a view of the model data. The identifier may be the same in the model data and the maintenance information (e.g., the same asset number) or the identifier may be different in the model data and the maintenance information. When the identifiers are different, a table stored to correlate identifiers between the model data and the maintenance information. The interactive user display may display information from the model data and the maintenance data such as previously-performed maintenance, future scheduled maintenance, component capabilities, component manufacturer, component warranty information, manufacturer contact information, work orders, repair guides, and user's manuals.

Figure 2:
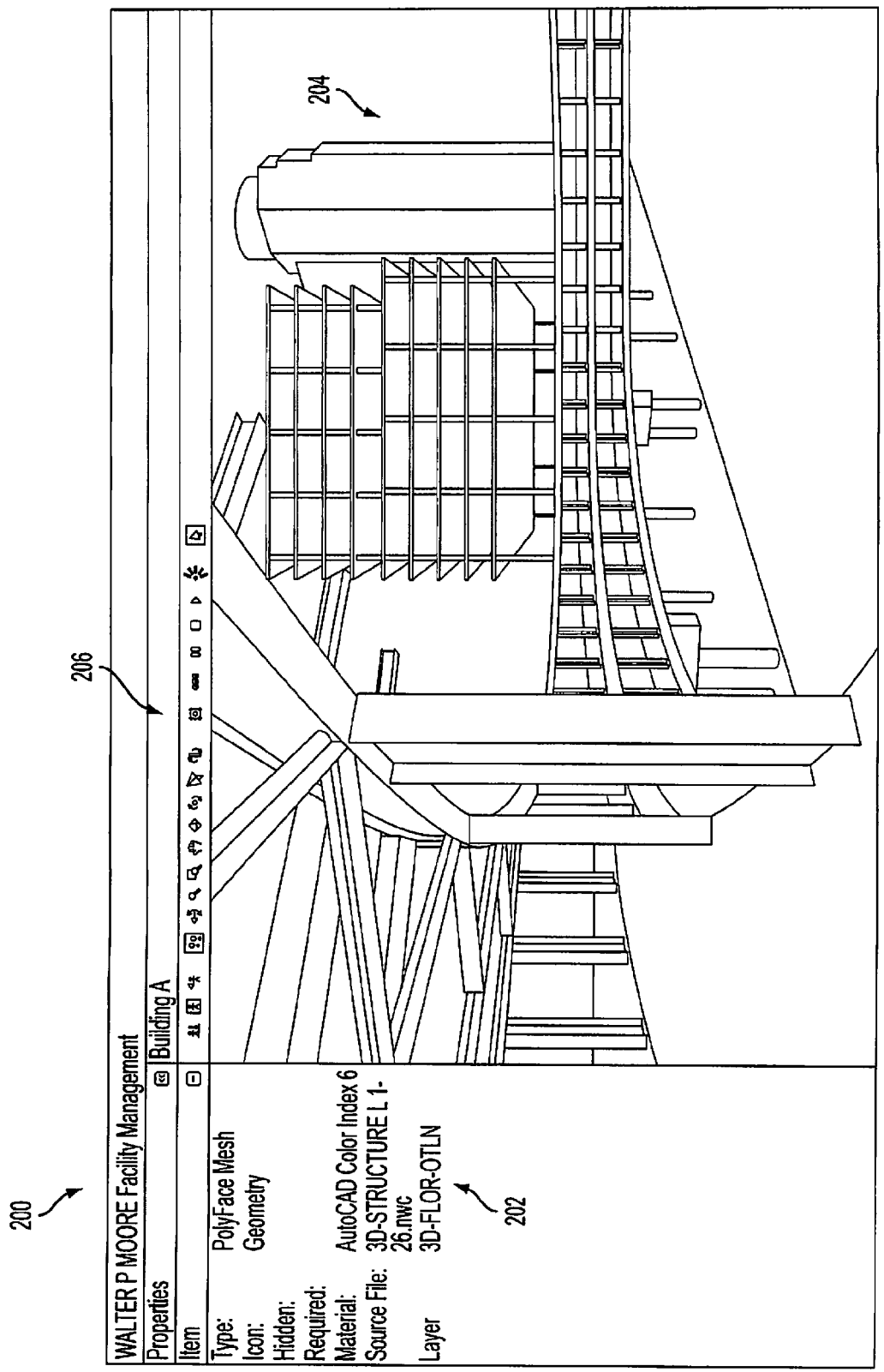
FIG. 2 is a drawing illustrating an exemplary facilities management information display of a high-rise tower according to one embodiment of the disclosure.

FIG. 2 is a drawing illustrating an exemplary facilities management information display of a high-rise tower according to one embodiment of the disclosure. A building information display 200 may include a building view 204, an information view 202, and a toolbar 206. The building view 204 may be a three-dimensional computer assisted design (3D CAD) drawing. The 3D CAD drawing may be stored locally, accessed remotely, or rendered remotely and displayed on the display 200. The building view 204 may display a high-rise tower or other building structure.

According to one embodiment, the building view 204 may be manipulated by turning on and off certain filters (not shown). For example, a filter may be activated to only display even or odd floors of the building in the building view 204. In another example, a filter may be activated to only display garage levels or commercial levels in the building view 204. In yet another example, a filter may be activated to not display walls within the building view 204. Filters and other controls may be controlled through a toolbar 206. The toolbar 206 may also change view and perspective information for the building view 204. For example, the toolbar 206 may include zoom and rotate buttons.

Figure 3:
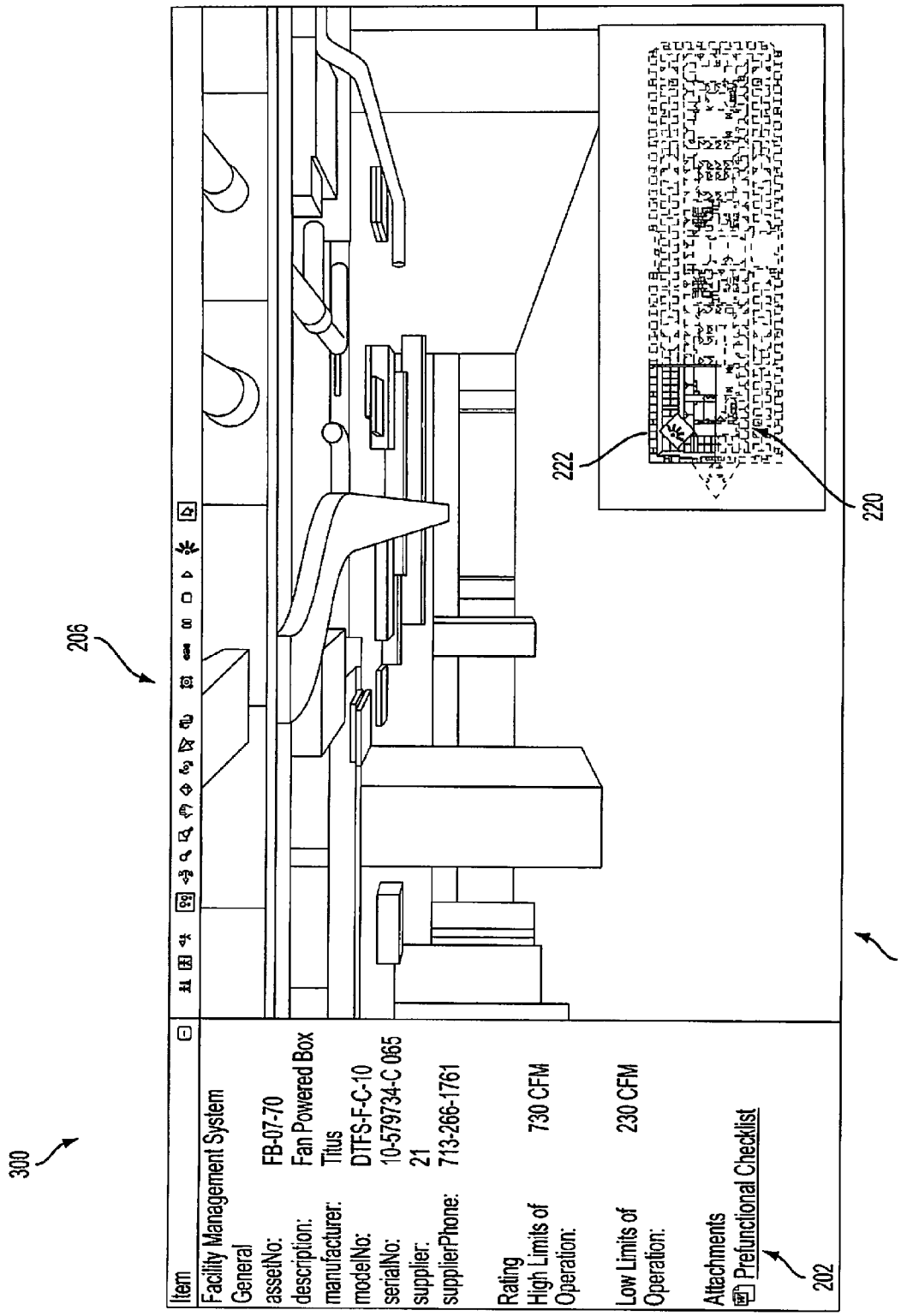
FIG. 3 is a drawing illustrating an exemplary facilities management information display of a single floor of a high-rise tower according to one embodiment of the disclosure.

Alternatively, a user may navigate through the building view 204 by clicking and dragging within the building view 204. After navigating to a particular floor the building view 204 may be updated as shown in FIG. 3. FIG. 3 is a drawing illustrating an exemplary facilities management information display of a single floor of a high-rise tower according to one embodiment of the disclosure. According to one embodiment, a user may add bookmarks designating certain locations within the building view 204 to allow quick recall to a particular location. For example, a bookmark may define "office 38S" or "floor 38 south elevator bank." According to another embodiment, the bookmarks may be pre-populated views or system-designed views.

A user may also navigate through the building view 204 by clicking on a location in a two-dimensional (2D) view 220 displayed in the building view 204. The 2D view 220 may be displayed on or hidden from the building view 204 by selecting an icon in the toolbar 206 or pressing a hotkey or hotkey combination. Selecting a location on the 2D view 220 may update the building view 204 to display an environment near the selected region of the 2D view 220. According to one embodiment, the 2D view 220 responds to the user by highlighting a region 222 of the 2D view 220 when a user selects the region 222 or places a mouse cursor over the region 222.

A display 300 of FIG. 3 may also include the information view 202, which displays information about one or more components selected in the building view 204. For example, when no component is selected the information view 202 may display information about the 3D CAD file displayed in the building view 204. After a component is selected in the building view 204, the information view 202 may be updated with information such as model data and maintenance data about the selected component. Maintenance data for the information view 202 may be obtained from a computerized maintenance management system (CMMS) or other database. The information view 202 may include data such as part information about the selected components, capabilities of the selected component, and/or scheduled and completed maintenance for the selected component. The information view 202 may be hidden or displayed in the display 200. More details of the information view 202 are described with reference to FIG. 4 below.

Figure 4:
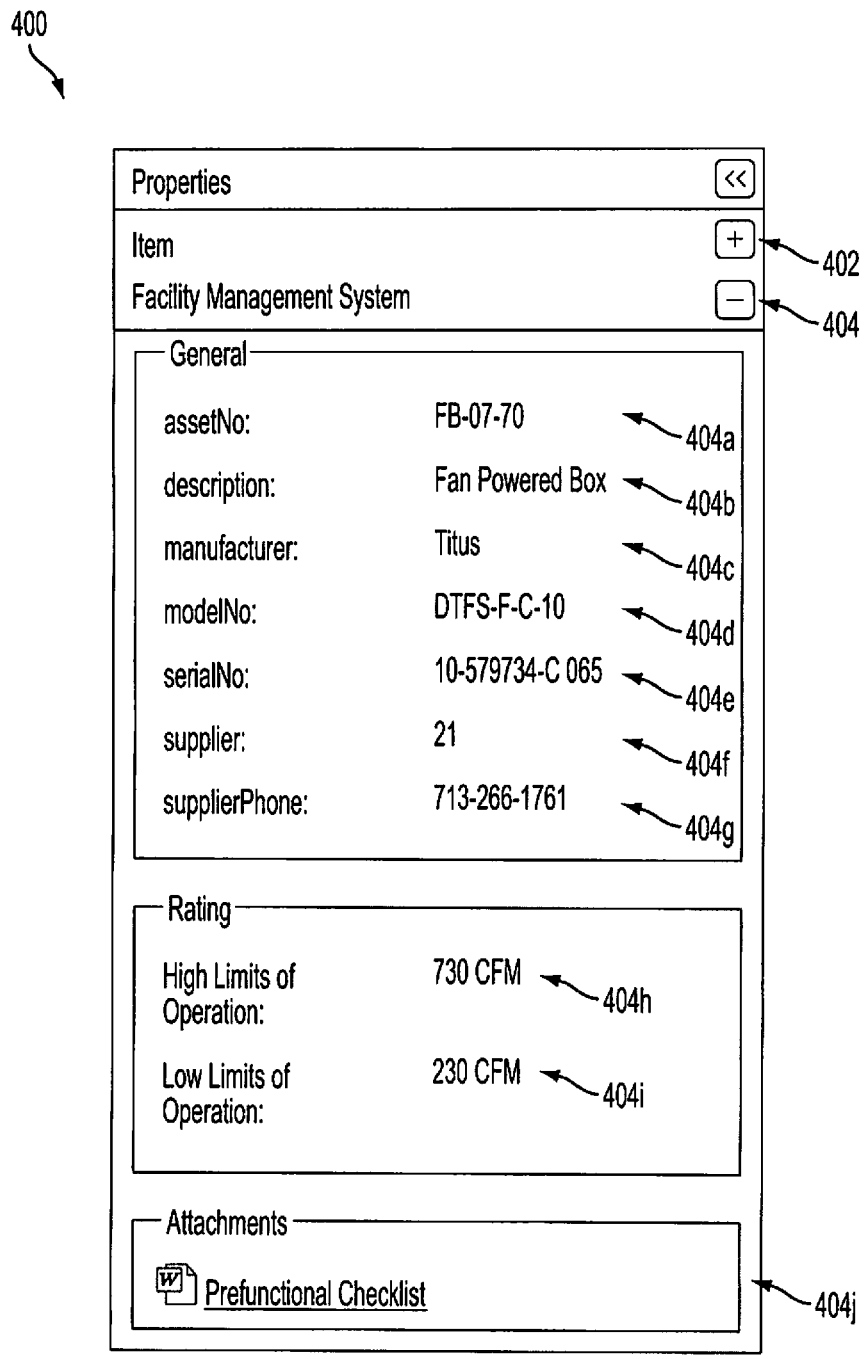
FIG. 4 is a drawing illustrating an exemplary display of component information including maintenance information according to one embodiment of the disclosure.

FIG. 4 is a drawing illustrating an exemplary display of component information including maintenance information according to one embodiment of the disclosure. An information view 400 may include a number of categories 402 and 404, which may be expanded or collapsed. For example a category 402 titled "Item" may display information regarding the selected component obtained from the 3D CAD drawing when the category 402 is expanded. A category 404 titled "Facility Management System" may include information regarding the selected component obtained from a CMMS (such as Mainsaver) or other database source when the category 404 is expanded. For example, the display may include a unique identifier 404a, a description 404b, a manufacturer label 404c, a model number 404d, a serial number 404e, a supplied identifier 404f, and supplier contact information 404g. The information view 400 may also include capability information such as a high limit of operation 404h and a low limit of operation 404i. According to one embodiment, the information view 400 may also include attached documents 404j, which may make additional information available to the user. For example, the attached documents 404j may include checklists, repair manuals, instructions manuals, and/or ordering information. Although the items 404a-404j may be illustrated as labels in FIG. 4, the items 404a-404j may alternatively be text boxes, which allow a user to modify the value of the items 404a-404j. As described below, when the user modifies a value for one of the items 404a-404j a computer system displaying the information view 400 may push the modified data to the CMMS to update database records. Although updating CMMS information is described, a similar process may be used to update model information. For example, if the building is modified after the initial model is created, then the model may be later updated with the building modifications.

Figure 5:
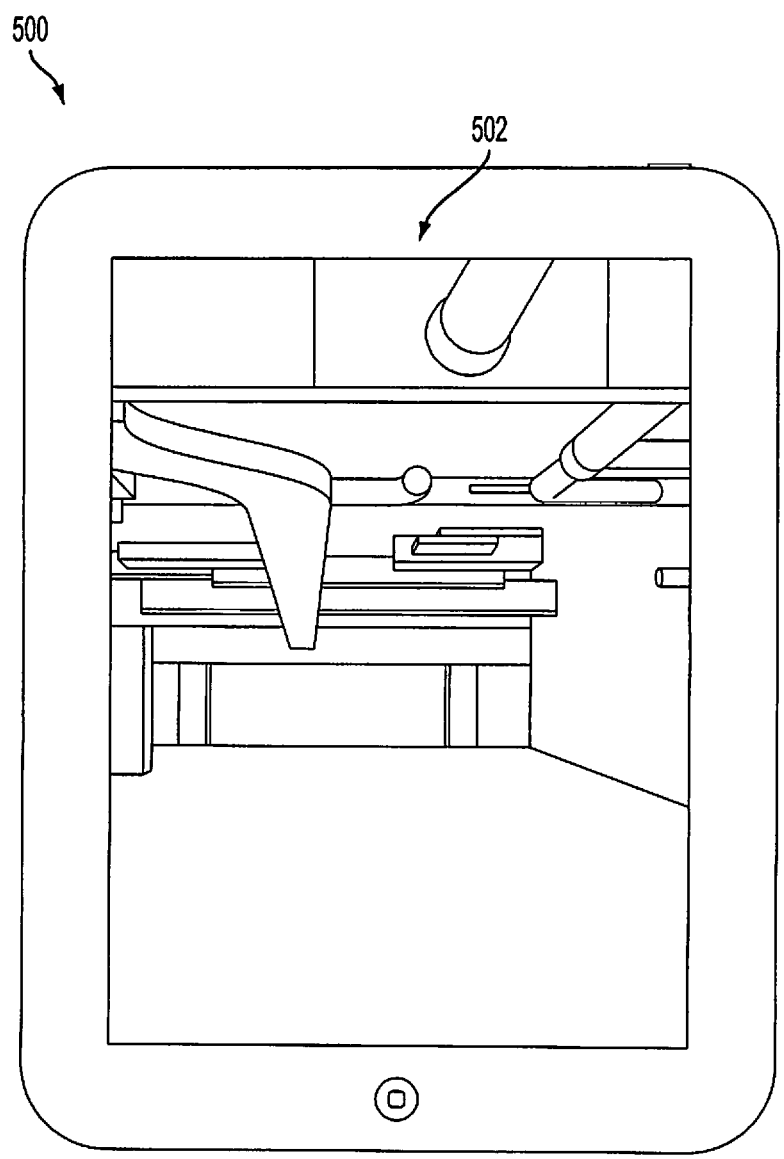
FIG. 5 is a drawing illustrating an exemplary mobile display of a facilities management information system according to one embodiment of the disclosure.
Figure 7:
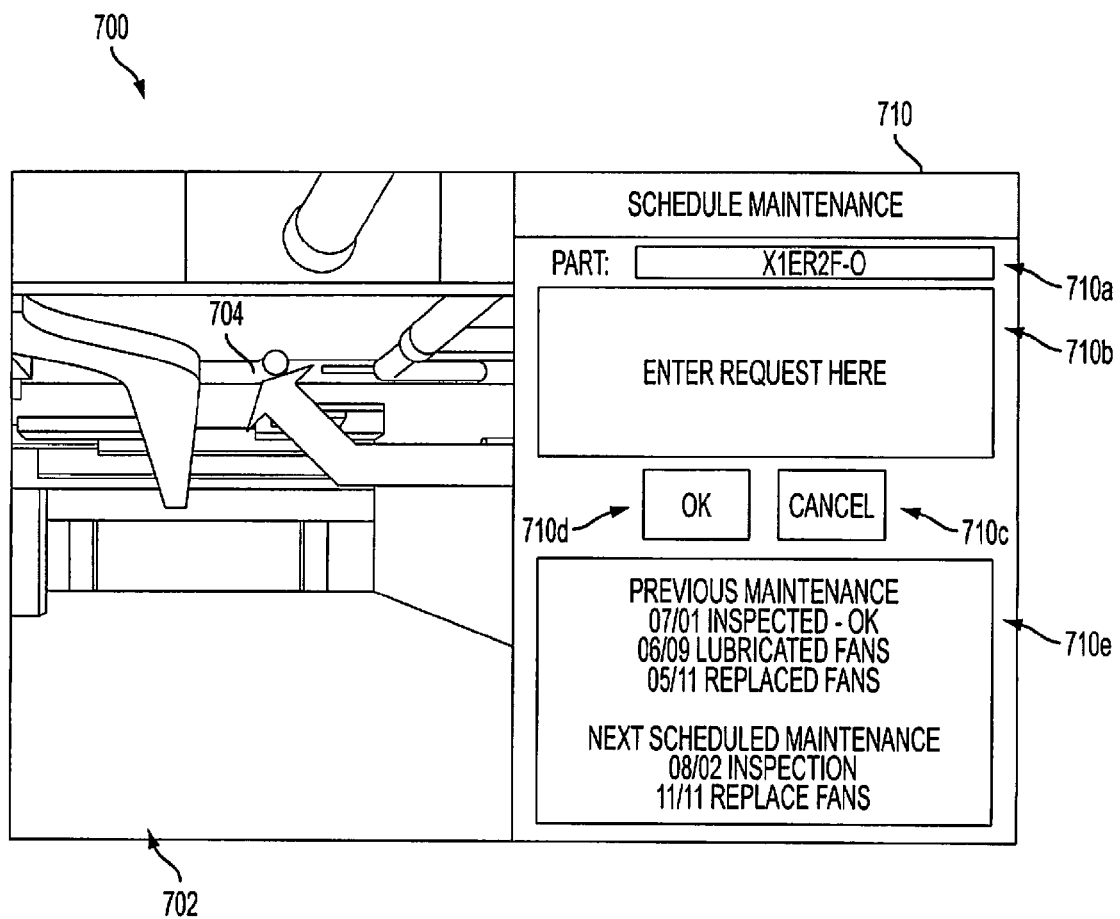
FIG. 7 is a block diagram illustrating an exemplary display for scheduling maintenance of a component in a facilities management information system according to one embodiment.
Figure 8:
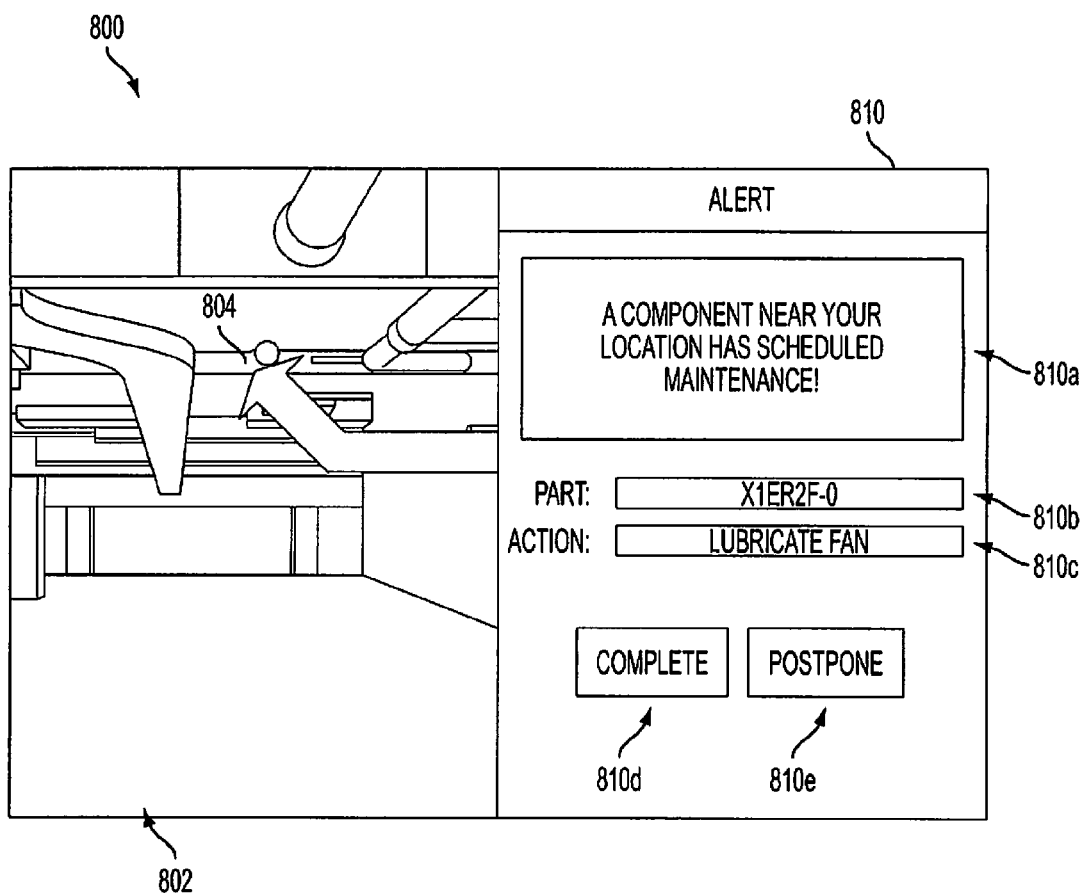
FIG. 8 is a block diagram illustrating an exemplary display for alerting a technician of scheduled maintenance for a component in a facilities management information system according to one embodiment.

According to one embodiment, the display of the information view and the building view may be accessible from a mobile device. FIG. 5 is a drawing illustrating an exemplary mobile display of a facilities management information system according to one embodiment of the disclosure. The unique capabilities of a mobile device such as a mobile phone, a tablet computer, a personal digital assistance (PDA), a netbook, and/or a laptop computer may improve navigation through a building view and improve accessibility of component information. According to one embodiment, a display 502 of a mobile device 500 displays a building view and may display information regarding selected components in a sidebar as illustrated in FIG. 3 and FIG. 4 above or as a pop-up message as shown in FIG. 7 and FIG. 8 as described below. The mobile device 500 is further described with reference to FIG. 6 below.

Figure 6:
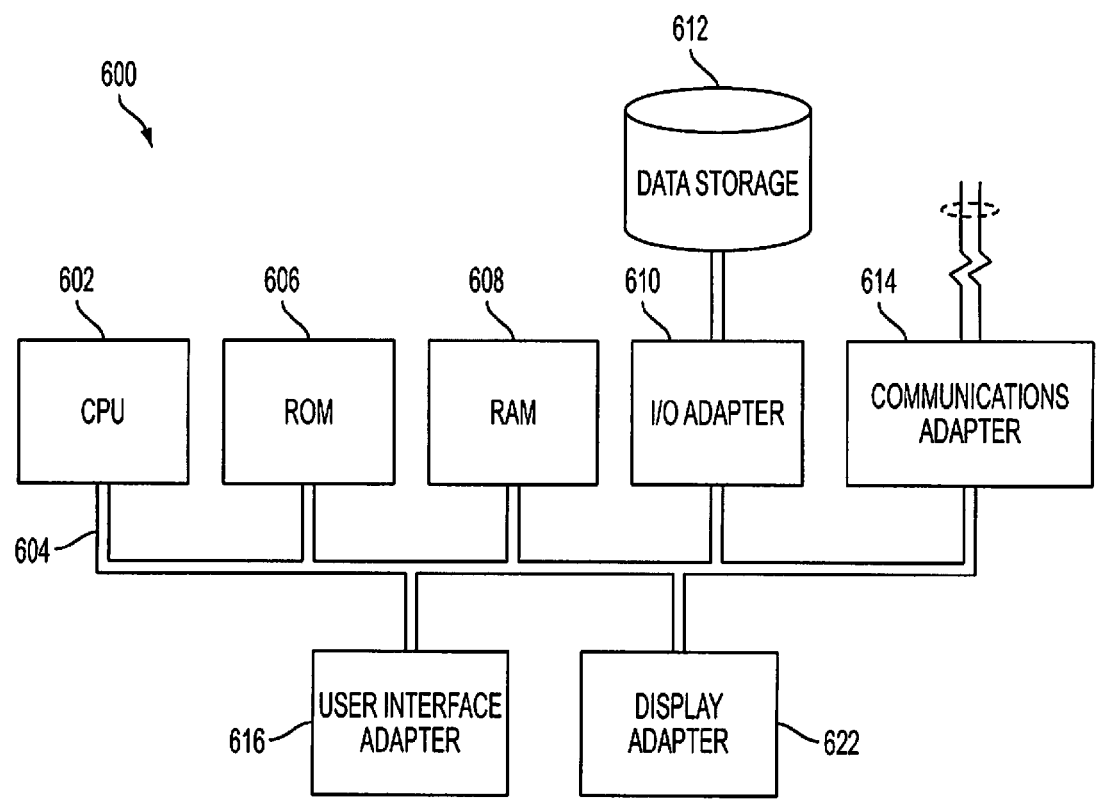
FIG. 6 is a block diagram illustrating an exemplary mobile device for displaying and interacting with a facilities management information system according to one embodiment of the disclosure.

FIG. 6 is a block diagram illustrating an exemplary mobile device for displaying and interacting with a facilities management information system according to one embodiment of the disclosure. A computer system 600 may embody, for example, the mobile device 500 of FIG. 5. The central processing unit ("CPU") 602 may be coupled to the system bus 604. The CPU 602 may be a general purpose CPU or microprocessor, graphics processing unit ("GPU"), microcontroller, or the like. The present embodiments are not restricted by the architecture of the CPU 602 so long as the CPU 602, whether directly or indirectly, supports the modules and operations as described herein. The CPU 602 may execute the various logical instructions according to the present embodiments.

The computer system 600 may also include random access memory (RAM) 608, which may be SRAM, DRAM, SDRAM, or the like. The computer system 600 may utilize RAM 608 to store the various data structures used by a software application such as databases, tables, and/or records. The computer system 600 may also include read only memory (ROM) 606 which may be PROM, EPROM, EEPROM, optical storage, or the like. The ROM may store configuration information for booting the computer system 600. The RAM 608 and the ROM 606 hold user and system data.

The computer system 600 may also include an input/output (I/O) adapter 610, a communications adapter 614, a user interface adapter 616, and a display adapter 622. The I/O adapter 610 and/or the user interface adapter 616 may, in certain embodiments, enable a user to interact with the computer system 600. For example, the user interface adapter 616 may couple the computing system 600 to input devices such as a mouse, a keyboard, a track pad, and/or a touch screen. In a further embodiment, the display adapter 622 may display a graphical user interface associated with a software or web-based application.

The I/O adapter 610 may connect one or more storage devices 612, such as one or more of a hard drive, a compact disk (CD) drive, a floppy disk drive, and a tape drive, to the computer system 600. The communications adapter 614 may be adapted to couple the computer system 600 to a network, which may be one or more of a local area network (LAN), wide area network (WAN), and/or the Internet. The I/O adapter 610 may be adapted to couple the computer system 600 to a storage device 612. The display adapter 622 may be driven by the CPU 602 to control a display. For example, the display adapter may display the building and information views illustrated in FIG. 2, FIG. 3, FIG. 4, and FIG. 5 on a liquid crystal display (LCD) or an electronic ink (eInk) display.

According to one embodiment, the communications adapter 614 may be coupled to a device for determining a location of the computer system 600. For example, the adapter 614 may be coupled to a global positioning system (GPS) receiver for determining a longitude, latitude, and/or elevation of the computer system 600. In another example, the communications adapter 614 may be coupled to a radio frequency identification (RFID) receiver, or any other near field communication (NFC) device. The adapter 614 may receive from the RFID receiver a scan code, which may be used to locate location information. For example, an RFID tag may be scanned by the RFID receiver when entering a room, floor, and/or access space of a building, then the received code matched to the RFID tag's location in the building. Alternatively, RFID tags may be placed on components within the building and the tag may be scanned by an RFID scanner to identify a particular component identification for searching a 3D CAD model or CMMS. In yet another example, the adapter 614 is coupled to a barcode reader. The adapter 614 may receive from the bar code reader a scan code, which may be used to locate location information from a reference table. In another example, the adapter 614 is coupled to a camera, which may take pictures of a user's surrounding and determine the user's location to allow display of an appropriate environment from a model. In a further example, the adapter 614 is coupled to inertial sensors such as a compass and/or accelerometer to determine a user's movement from a base location and determine an environment for display. In yet another example, the adapter 614 is coupled to a wireless network hotspot (such as WiFi), and the network identifier of the network hotspot has a known location, which the computer system 600 identifies as its location.

A user operating a mobile device as illustrated in FIG. 5 and FIG. 6 may interact with the building view 502 by physically moving the mobile device 500. For example, the mobile device 500 may determine a user's current position through one of the systems described above such as GPS, RFID, barcodes, and/or camera pictures. Once the users initial position is determined the building view 502 is updated with the environment of the user's current position. The user may then physically point the mobile device 500 up at the ceiling and the building view 502 is updated with a view of the ceiling and/or components in the ceiling above the user's position. Movement of the mobile device 500 may be determined through one of the positioning systems described above. Alternatively, movement of the mobile device 500 may be determined by inertial sensors by measuring an accelerometer, magnetometer, digital compass, or the like and computing the user's position and viewing angle from the user's original position determined by the position system. For example, after the user's original position is determined if the user rotates 180 degrees to view the other direction down a hallway, a digital compass in the mobile device 500 may detect the user's rotation and update the building view 502 to display the hallway in the direction the user is now facing.

According to one embodiment, the communications adapter 614 may allow the computer system 600 to communicate with an equipment management system. For example, the communications adapter 614 may allow the computer system 600 to alter temperature and/or humidity settings in a building, activate and/or deactivate alarm systems, and operate door locks in the building. In another example, the communications adapter 614 may allow the computer system 600 to interact with other commercial systems for managing equipment in the building such as a security system and/or a telecommunications system.

The applications of the present disclosure are not limited to the architecture of computer system 600. Rather the computer system 600 is provided as an example of one type of computing device that may be adapted to perform functions for displaying and interacting with the building information system as described above with respect to FIGS. 2, 3, 4, and 5. For example, any suitable processor-based device may be utilized including, without limitation, personal data assistants (PDAs), tablet computers, smartphones, computer game consoles, and multi-processor servers. Moreover, the systems and methods of the present disclosure may be implemented on application specific integrated circuits (ASIC), very large scale integrated (VLSI) circuits, or other circuitry. In fact, persons of ordinary skill in the art may utilize any number of suitable structures capable of executing logical operations according to the described embodiments.

A user may interact with the model information through forms on the displays illustrated in FIG. 2, FIG. 3, FIG. 4 and FIG. 5. According to one embodiment, the displays are shown on the mobile device 500 of FIG. 5. The forms may allow a user, such as a maintenance technician, to enter a work order request through a form illustrated in FIG. 7 or to receive notification of a maintenance assignment through a form illustrated in FIG. 8. FIG. 7 is a block diagram illustrating an exemplary display for scheduling maintenance of a component in a building management information system according to one embodiment. A display 700 may include a building view 702. After a user selects a component 704 from the building view 702, a form 710 is displayed to allow the user to enter a work order or maintenance request. The form 710 may include information 710a about the selected part, a text box 710b for entering the work order request, and command buttons 710c and 710d for cancelling or accepting the work order request, respectfully. The form 710 may also include other information 710e about the component 704. For example, the information 710e may include previously completed maintenance or future scheduled maintenance for the component 704.

When information is entered into the text box 710b and the command button 710d is activated the information in the text box 710b may be recorded for a component corresponding to the part 710a in the CMMS. According to one embodiment, the updated information may be transmitted directly to the CMMS. According to another embodiment, the updated information may be sent to an intermediate computer system, which processes the information and updates the CMMS accordingly. Although FIG. 7 illustrates the entry of a work order request, which may be transmitted to the CMMS, other data may be entered into a display similar to the display 700 and used to update component information in the CMMS.

FIG. 8 is a block diagram illustrating an exemplary display for alerting a technician of scheduled maintenance for a component in a facilities management information system according to one embodiment. A display 800 may include a building view 802. While a user is viewing information about the environment displayed in the building view 802, a user may be displayed an alert 810 about a component with scheduled maintenance. According to one embodiment, the alert 810 is generated from location information of the mobile device carried by the user. According to another embodiment, the alert 810 is transmitted to the user's mobile device from a supervisor or server. The alert 810 may notify the user of work assigned to a component 802. The alert 810 may include a message 810a providing instructions to the user, a part identification 810b, an action to be performed 810c, and inputs 810d and 810e to allow the user to indicate that the maintenance was completed or postponed, respectively.

Figure 9:
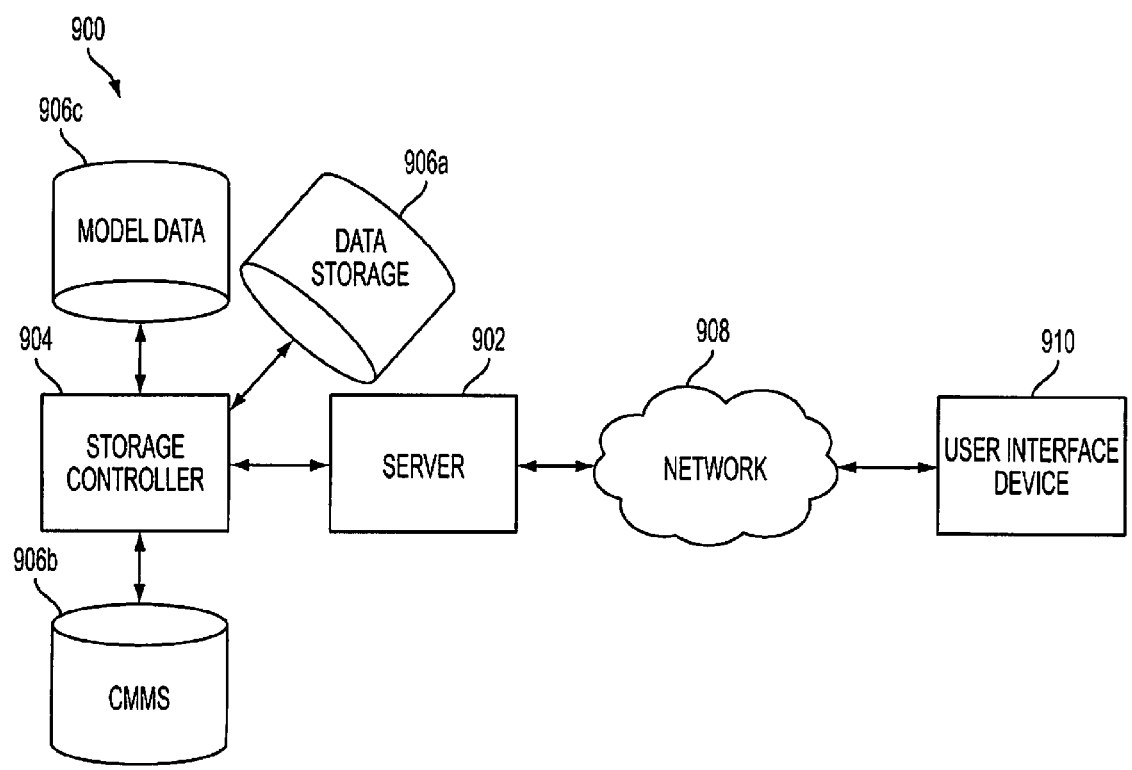
FIG. 9 is a block diagram illustrating an exemplary facilities management information system according to one embodiment of the disclosure.

FIG. 9 is a block diagram illustrating an exemplary facilities management information system according to one embodiment of the disclosure. A system 900 may include a server 902, data storage devices 906a, 906b, 906c, a network 908, and a user interface device 910. The data storage devices 906 may include different devices or databases storing, for example, information about a building model in model data storage 906c, building maintenance data in CMMS data storage 906b, and other information in data storage 906a. According to one embodiment, a database residing on data storage 906a includes a table mapping components in the model data 906c to maintenance data in the data storage 906b. For example, a database stored in the data storage 906a may map unique identifiers in the model data 906c to unique identifiers in the CMMS 906b. According to another embodiment, the data storage 906a may include a table mapping scanned barcodes, RFID tags, and/or WiFi hotspots to locations in a building. In a further embodiment, the system 900 may include a storage controller 904, or storage server configured to manage data communications between the data storage device 906 and the server 902 or other components in communication with the network 908. In an alternative embodiment, the storage controller 904 may be coupled to the network 908. In yet another embodiment, the data storage devices 906 may be located in separate locations and coupled together through the network 908.

In one embodiment, the user interface device 910 is referred to broadly and is intended to encompass a suitable processor-based device such as a desktop computer, a laptop computer, a personal digital assistant (PDA) or tablet computer, a smartphone or other a mobile communication device or organizer device having access to the network 908. In a further embodiment, the user interface device 910 may access the Internet or other wide area or local area network to access a web application or web service hosted by the server 902 and provide a user interface for enabling a user to enter or receive information.

The network 908 may facilitate communications of data between the server 902 and the user interface device 910. The network 908 may include any type of communications network including, but not limited to, a direct PC-to-PC connection, a cellular network, a satellite network, a local area network (LAN), a wide area network (WAN), a modem-to-modem connection, the Internet, a combination of the above, or any other communications network now known or later developed within the networking arts which permits two or more computers to communicate, one with another. In one embodiment, the user interface device 910 accesses the server 902 through an intermediate sever (not shown). For example, in a cloud application the user interface device 910 may access an application server. The application server fulfills requests from the user interface device 910 by accessing a database through the storage controller 904.

Applications and/or scripts on the server 902 may access data stored in the data storage devices 906 via a Storage Area Network (SAN) connection, a LAN, a data bus, or the like. The data storage devices 906 may include a hard disk, hard disks arranged in an Redundant Array of Independent Disks (RAID) array, a tape storage drive comprising a physical or virtual magnetic tape data storage device, and/or an optical storage device. The data may be arranged in a database and accessible through Structured Query Language (SQL) queries, or other data base query languages or operations.

In one embodiment, the databases may be stored on a remote server or a cloud computing system and accessible through web services. Thus, the database need not be stored locally on the device accessing records of the database. The databases may be part of legacy commercial systems accessible through API's. For example CMMS 906b may consist of CMMS records for an existing legacy FM system such as Mainsaver accessed through an API connection to Mainsaver. The data may be separately accessible from Mainsaver's native interface. Similarly, model data 906c may be a virtual model stored within a commercial program such as Navis-Works accessed through an API connection to NavisWorks. Similarly, server 902 may access other services such as, for example, commercial systems for managing equipment in the building such as a security system and/or a telecommunications system, altering temperature and/or humidity settings in a building, activating and/or deactivating alarm systems, and operating door locks in the building.

Figure 10:
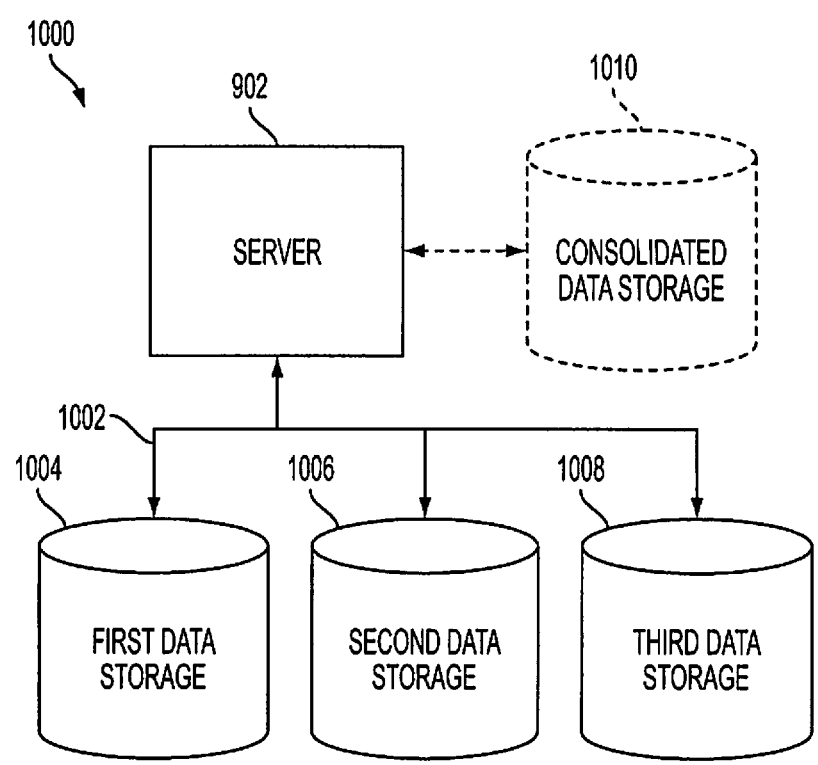
FIG. 10 is a block diagram illustrating an exemplary data storage for a facilities management information system according to one embodiment of the disclosure.

FIG. 10 is a block diagram illustrating an exemplary data storage for a facilities management information system according to one embodiment of the disclosure. In one embodiment, a data management system 1000 may include the server 902. The server 902 may be coupled to a data-bus 1002. In one embodiment, the data management system 1000 may also include a first data storage device 1004, a second data storage device 1006, and/or a third data storage device 1008. In further embodiments, the data management system 1000 may include additional data storage devices (not shown). In such an embodiment, each data storage device 1004, 1006, and 1008 may each host a separate database that may, in conjunction with the other databases, contain redundant data. Alternatively, a database may be spread across storage devices 1004, 1006, and 1008 using database partitioning or some other mechanism. Alternatively, the storage devices 1004, 1006, and 1008 may be arranged in a RAID configuration for storing a database or databases through may contain redundant data. Data may be stored in the storage devices 1004, 1006, 1008, and 1010 in a database such as a relational database.

In one embodiment, the server 902 may submit a query to selected data from the storage devices 1004 and 1006. The server 902 may store consolidated data sets in a consolidated data storage device 1010. In such an embodiment, the server 902 may refer back to the consolidated data storage device 1010 to obtain a set of records. Alternatively, the server 902 may query each of the data storage devices 1004, 1006, and 1008 independently or in a distributed query to obtain the set of data elements. In another alternative embodiment, multiple databases may be stored on a single consolidated data storage device 1010.

In various embodiments, the server 902 may communicate with the data storage devices 1004, 1006, and 1008 over the data-bus 1002. The data-bus 1002 may comprise a SAN, a LAN, or the like. The communication infrastructure may include Ethernet, Small Computer System Interface (SCSI), Serial Advanced Technology Attachment (SATA), Advanced Technology Attachment (ATA), Cloud Attached Storage, and/or other similar data communication schemes associated with data storage and communication. For example, the server 902 may communicate indirectly with the data storage devices 1004, 1006, 1008, and 1010 through a storage server or the storage controller 904.

The server 902 may include modules for interfacing with the data storage devices 1004, 1006, 1008, and 1010, interfacing a network 908, interfacing with a user through the user interface device 910, and the like. In a further embodiment, the server 902 may host an engine, application plug-in, or application programming interface (API).

According to one embodiment, users may subscriber to services provided by the server 902. For example, a user may subscribe one or more client devices to a service on the server 902 that provides model data for a building and maintenance information for components in the building. When construction and repairs are performed on the building, the client devices have access to the newest information through the subscription service. For example, if a new parking garage is constructed and attached to the building, the updated designs may be provided to the client device through the server 902. As a result, a user will not have to consult multiple documents or database to determine component information for the building.

Figure 11:
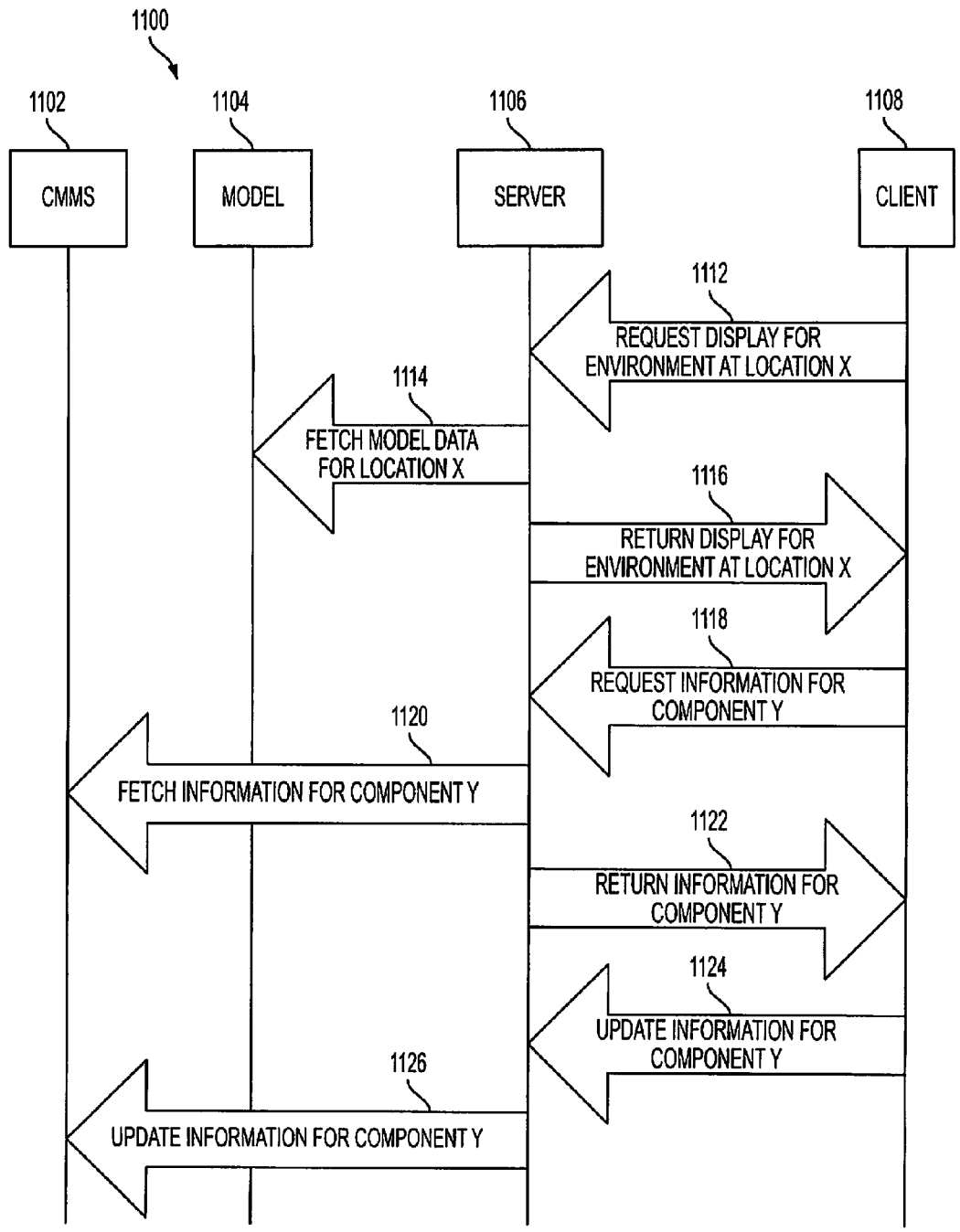
FIG. 11 is a call diagram illustrating communications between a client device and a server for displaying model and maintenance data according to one embodiment.

FIG. 11 is a call diagram illustrating communications between a client device and a server for displaying model and maintenance data according to one embodiment. A call diagram 1100 starts at call 1112 when a client 1108, such as the mobile device of FIG. 5, transmits a request to display an environment at location X to a server 1106. The client device 1108 may access the server 1106 through an application program interface (API) and/or a web interface. The server 1106 fetches display information for location X from a model 1104 at call 1114. The data may be returned to the client device 1108 at call 1116 either as raw model data or as a rendered display, such as with a remote terminal. At call 1118 the client device 1108 requests information for component Y. A user of the client device 1108 may request information about the component Y, or the client device 1108 may be requesting the information without user interaction. At call 1120 the server 1106 fetches information for component Y from a CMMS 1102. According to one embodiment, the server 1106 may convert an identifier for component Y transmitted by the client device 1108 to an identifier used to uniquely identify component Y in the CMMS 1102. At call 1122 the server 1106 returns the information for component Y to the client device 1108. The client device 1108 may then display the information for component Y to the user. At call 1124 the client device 1108 may receive an update regarding component Y from a user operating the client device 1108 and transmit the update to the server 1106. For example, a maintenance request for component Y may be entered by the user of the client device 1108. At call 1126 the server 1106 transmits the updated information to the CMSS 1102. The server 1106 may also transmit updated information to the model 1104.

Figure 12:
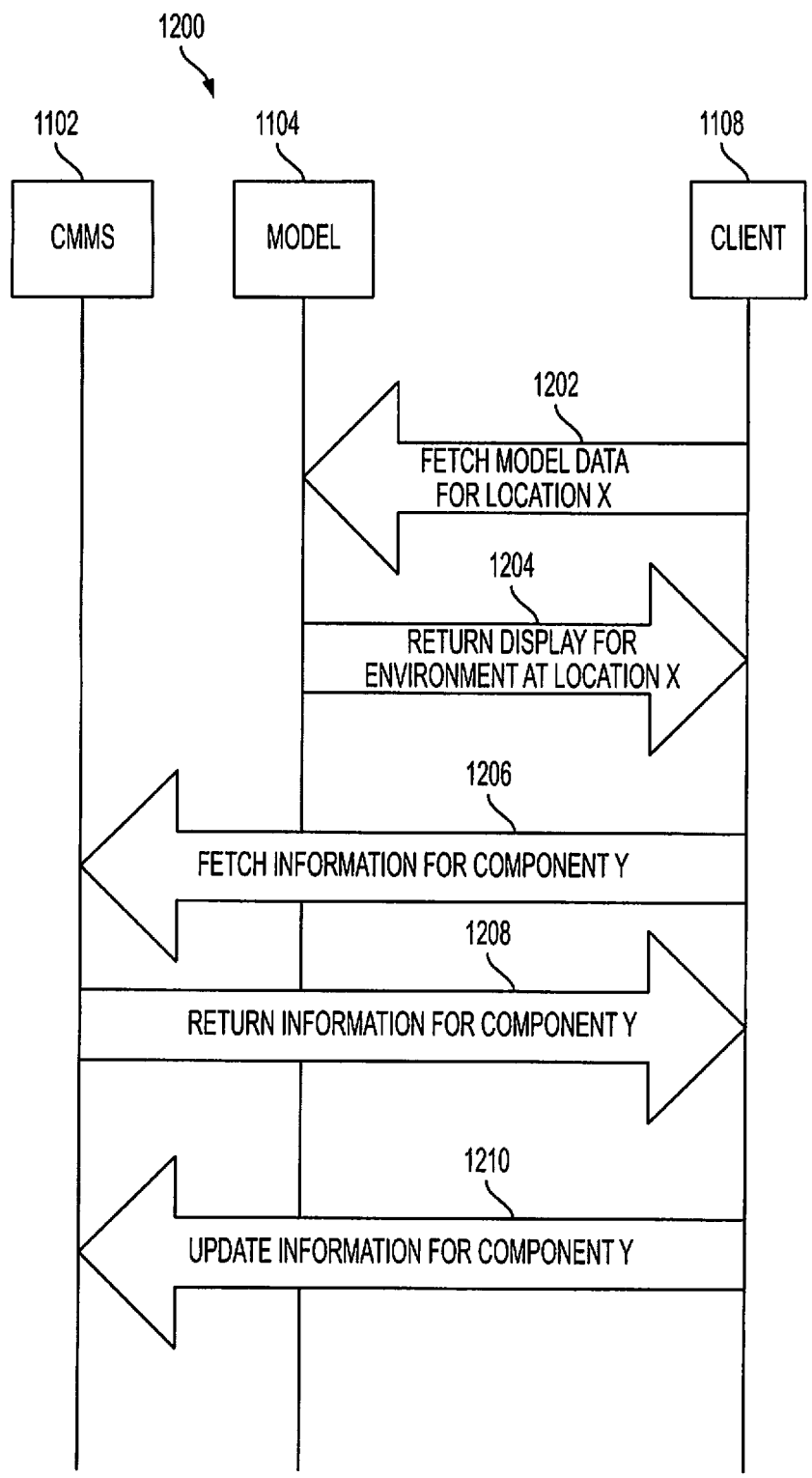
FIG. 12 is a call diagram illustrating communications between a client device and two data sources for displaying model and maintenance data according to one embodiment.

Although the call diagram illustrated in FIG. 11 describes a client device 1108 accessing a server 1106 that relays requests to the model 1104 and the CMMS 1102 the client device 1108 may also directly communicate with the model 1104 and the CMMS 1102 according to one embodiment of the disclosure. FIG. 12 is a call diagram illustrating communications between a client device and two data sources for displaying model and maintenance data according to one embodiment. At call 1202 the client device 1108 fetches model data for location X from the model data store 1104. The model data store 1104 returns display for an environment at location X at call 1204, which may be displayed on the client device 1108. At call 1206 the client device 1108 fetches information regarding a selected component Y from the CMMS data store 1102. At call 1208 the CMMS data store 1102 returns information regarding component Y, such as maintenance information. At call 1210 the client device 1108 may update information regarding component Y stored in the CMMS data store 1102. Although not shown, the client device 1108 may also update information regarding component Y in the model data store 1104.

Figure 13:
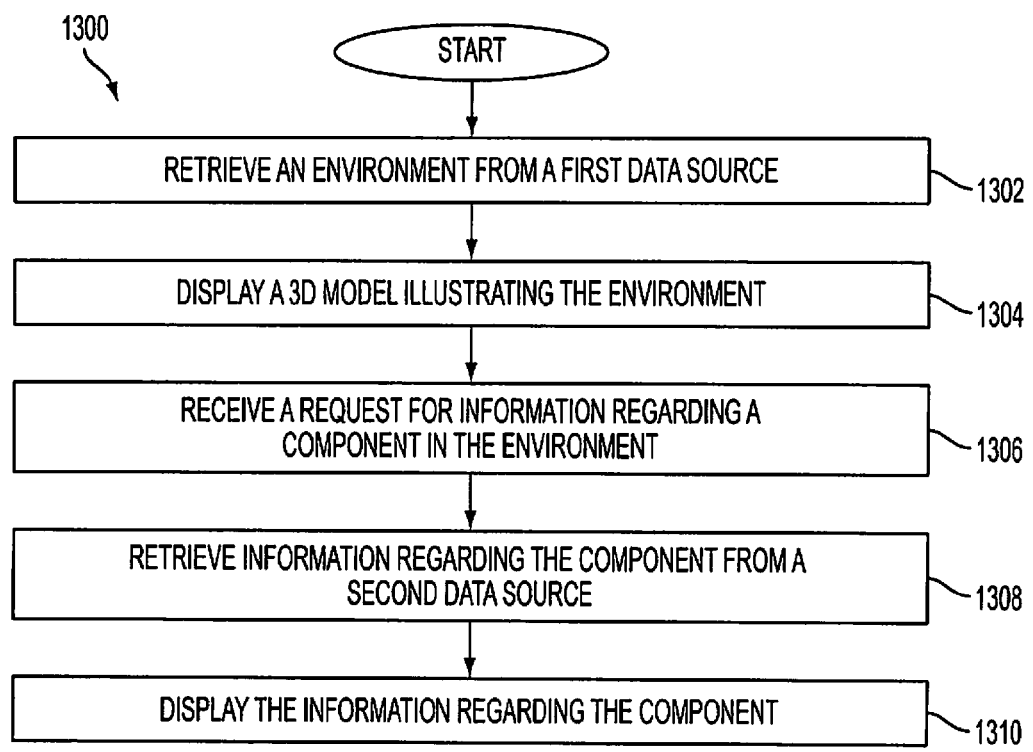
FIG. 13 is a flow chart illustrating an exemplary method for operating a client device with a facilities management information system according to one embodiment.

FIG. 13 is a flow chart illustrating an exemplary method for operating a client device according to one embodiment. A method 1300 begins at block 1302 retrieving an environment from a first data source including components in the environment. The environment may correspond to a user's location. At block 1304, the environment is displayed in a three dimensional model. At block 1306, a request is received for information regarding a component in the environment. The request may be, for example, a request for maintenance-related information about the component including a maintenance schedule or maintenance manuals. At block 1308, information is retrieved from a second data source regarding the component. At block 1310, the component information is displayed. The information may be displayed alongside the three dimensional model displayed at block 1304 or may be integrated into the three dimensional model displayed at block 1304.

If implemented in firmware and/or software, the functions described above with reference to FIG. 11, FIG. 12, and FIG. 13 may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method, comprising:
retrieving, by a client, from a first model data source data representing an environment in a building and at least one component in the environment;
displaying, by the client, a three-dimensional model of the building illustrating data from the first model data source, including the at least one component;
receiving, at the client, a request for information regarding a component selected from the at least one component, the first model data source containing a record for the selected component including an identifier identifying the selected component;
retrieving, by the client, information regarding the selected component from a second maintenance data source different from the first model data source, the maintenance data source containing a record for the selected component including the identifier identifying the selected component;
displaying, by the client, the information regarding the selected component comprising at least a previously-performed maintenance task and a future scheduled maintenance task; and
controlling, by the client, the at least one component to modify operation of the at least one component.

2. The method of claim 1, in which the step of retrieving information regarding the selected component from a second maintenance data source comprises retrieving information from a computerized maintenance management system (CMMS).

3. The method of claim 2, further comprising:
receiving a request to update component information for the selected component; and
storing the updated component information in the CMMS for the selected component.

4. The method of claim 2, in which the retrieved information comprises at least one of previously-performed maintenance, future-scheduled maintenance, and a work order.

5. The method of claim 1, further comprising:
determining a location of a mobile device before the step of retrieving from the first data source,
in which the step of retrieving from the first model data source comprises retrieving from a first model data source data representing an environment in the building and the at least one component in the environment in which the retrieved data represents the environment at the determined location of the mobile device.

6. The method of claim 5, in which the location comprises at least one of a global positioning system (GPS) position, a wireless network identifier, a position of a scanned radio frequency identification (RFID) tag, a position of a scanned barcode, and a position of a near field communications (NFC) device.

7. The method of claim 1, in which the step of retrieving from the first model data source data representing an environment in a building and components in said environment comprises retrieving the environment from a server coupled to the first model data source, and in which the step of retrieving information regarding the component from the second maintenance data source different from the first model data source comprises retrieving the component information from the server also coupled to the second maintenance data source.

8. The method of claim 2, further comprising simultaneously displaying information retrieved from a computerized maintenance management system (CMMS) along with the three-dimensional model.

9. The method of claim 1, further comprising displaying, by the client, an alter regarding the future scheduled maintenance task for the at least one component the displayed portion of the three-dimension model includes the at least one component with the future scheduled maintenance task.

10. A computer program product, comprising:
a non-transitory computer readable medium comprising:
code to retrieve from a first model data source data representing an environment in a building and at least one component in the environment;
code to display a three-dimensional model of the building illustrating data from the first model data source, including the at least one component;
code to receive a request for information regarding a component selected from the at least one component, the first model data source containing a record for the selected component including an identifier identifying the selected component;
code to retrieve information regarding the selected component from a second maintenance data source different from the first model data source, the maintenance data source containing a record for the selected component including the identifier identifying the selected component, wherein the retrieved information from the second maintenance data source for the selected component comprises at least a previously-performed maintenance task and a future scheduled maintenance task;
code to display the information regarding the selected component comprising at least the previously-performed maintenance task and the future scheduled maintenance task; and
code to control the at least one component to modify operation of the at least one component.

11. The computer program product of claim 10, in which the code to display model data comprises code to fetch data from a three-dimensional computer assisted design (CAD) file.

12. The computer program product of claim 11, in which the code to fetch information regarding the at least one component comprises code to fetch information from a computerized maintenance management system (CMMS).

13. The computer program product of claim 10, in which the medium further comprises:
code to receive a request to update component information for the selected component; and
code to store the updated component information in the CMMS for the selected component.

14. The computer program product of claim 10, in which the fetched information comprises at least one of previously-performed maintenance, future-scheduled maintenance, and a work order.

15. The computer program product of claim 10, in which the medium further comprises code to receive a location of a mobile device before displaying model data for the environment, in which the environment is an area near the location of the mobile device.

16. The computer program product of claim 10, in which the medium further comprises code to correlate a first identifier for the selected component in the first model data source to a second identifier for the selected component in the second maintenance data source, wherein the first identifier is different from the second identifier.

17. The computer program product of claim 12, in which the medium further comprises code to simultaneously display information for the at least one component from a computerized maintenance management system (CMMS) and the 3D CAD model.

18. The computer program product of claim 12, in which the medium further comprises code to display an alert regarding the future scheduled maintenance task for the at least one component when the displayed portion of the three-dimensional model includes the at least one component with the future scheduled maintenance task.

19. A computer program product, comprising:
a non-transitory computer readable medium comprising:
code to provide a three dimensional computer assisted design (3D CAD) model of a building to a client from a first model data source, wherein the 3D CAD model comprises at least one component, the first model data source containing a record for the at least one component including an identifier identifying the at least one component;
code to provide an interface for the 3D CAD model to the client including access to a computerized maintenance management system (CMMS) of a second maintenance data source, the maintenance data source containing a record for the at least one component including the identifier identifying the at least one component, wherein the second maintenance data source comprises at least a previously-performed maintenance task and a future scheduled maintenance task for the at least one component;
code to provide updates to the 3D CAD model of the first model data source to the client on a subscription basis;
code to receive commands for controlling the at least one component in the 3D CAD model to modify operation of the component; and
code to transmit commands to an equipment management system to modify operation of the at least one component.

20. The computer program product of claim 19, in which the medium further comprises:
code to provide an interface for receiving modified information for the CMMS; and
code to push the modified information to the CMMS.

21. The computer program product of claim 19, in which the interface includes access to maintenance information for components in the 3D CAD model.

22. The computer program product of claim 19, in which the 3D CAD model includes identifiers for the at least one component in the 3D CAD model correlating to identifiers for the at least one component in the CMMS.

23. The computer program product of claim 19, in which the interface is a web-based interface.

* * * * *